US007880615B2

(12) United States Patent
Kobayashi et al.

(10) Patent No.: US 7,880,615 B2
(45) Date of Patent: Feb. 1, 2011

(54) ELECTRONIC DEVICE MANUFACTURING SYSTEM AND ELECTRONIC DEVICE MANUFACTURING METHOD

(75) Inventors: Hiroshi Kobayashi, Kawasaki (JP); Shuichi Takeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 378 days.

(21) Appl. No.: 11/966,375

(22) Filed: Dec. 28, 2007

(65) Prior Publication Data

US 2008/0191879 A1 Aug. 14, 2008

(30) Foreign Application Priority Data

Feb. 9, 2007 (JP) ............... 2007-030682

(51) Int. Cl.
*G08B 13/14* (2006.01)
*H01L 21/00* (2006.01)
*H01P 11/00* (2006.01)
*B44C 1/17* (2006.01)
*G06K 19/06* (2006.01)

(52) U.S. Cl. ............ 340/572.1; 340/572.7; 340/572.8; 438/460; 29/600; 156/238; 235/492

(58) Field of Classification Search ............ 340/572.1, 340/572.7; 438/460; 29/600; 156/238
See application file for complete search history.

(56) References Cited

U.S. PATENT DOCUMENTS

| 7,633,394 | B2 * | 12/2009 | Forster | ............ 340/572.4 |
| 2004/0192011 | A1 * | 9/2004 | Roesner | ............ 438/460 |
| 2005/0032267 | A1 | 2/2005 | Liu et al. | |
| 2005/0076497 | A1 | 4/2005 | Mizuno et al. | |
| 2007/0141760 | A1 * | 6/2007 | Ferguson et al. | ............ 438/127 |
| 2007/0144662 | A1 * | 6/2007 | Armijo et al. | ............ 156/238 |
| 2008/0088448 | A1 * | 4/2008 | Steidinger | ............ 340/572.1 |
| 2009/0166431 | A1 * | 7/2009 | Aoyama | ............ 235/492 |

FOREIGN PATENT DOCUMENTS

| JP | 2000-200332 A | 7/2000 |
| JP | 2000-311226 A | 11/2000 |
| JP | 2001-351082 A | 12/2001 |

(Continued)

OTHER PUBLICATIONS

European Search Report dated May 13, 2008, issued in corresponding European Patent Application No. 07124167.3.

*Primary Examiner*—George A Bugg
*Assistant Examiner*—Jack Wang
(74) *Attorney, Agent, or Firm*—Fujitsu Patent Center (57) ABSTRACT

A tag manufacturing system includes an antenna forming apparatus which forms multiple antennas in such a way that the antennas are formed in a point-symmetrical arrangement including antenna orientations, on a long base sheet large enough to place multiple bases, and winds the base sheet into a roll body; an IC chip mounting apparatus which pulls the base sheet out of the roll body, mounts an IC chip on each of the antennas formed on the pulled base sheet in an orientation corresponding to an orientation of each antenna, and electrically connects the IC chip with the antenna; and a post-processing apparatus which performs post-processing of the base sheet with the IC chips mounted on the antennas to work up the base sheet into finished RFID tags.

10 Claims, 6 Drawing Sheets

FOREIGN PATENT DOCUMENTS

| | | |
|---|---|---|
| JP | 2002-525726 A | 8/2002 |
| JP | 2005-115916 A | 4/2005 |
| JP | 2005-165879 A | 6/2005 |
| WO | WO 98/28953 A2 | 7/1998 |
| WO | 00/16286 A | 3/2000 |
| WO | WO 2006/060324 A1 | 6/2006 |

* cited by examiner

ELECTRONIC DEVICE MANUFACTURING SYSTEM AND ELECTRONIC DEVICE MANUFACTURING METHOD

BACKGROUND OF THE INVENTION

1. Field of the Invention

The present invention relates to an electronic device manufacturing system and electronic device manufacturing method for manufacturing electronic devices which include a conductor pattern formed on a base and a circuit chip electrically connected to the conductor pattern.

2. Description of the Related Art

Electronic devices which include a conductor pattern formed on a base such as a printed circuit board and a circuit chip electrically connected to the conductor pattern have been known widely. Such electronic devices are used to control electronic equipment, being incorporated in the electronic equipment, or used as single units to exchange information with the external equipment. As an example of such electronic devices, there have recently been proposed various types of RFID (Radio_Frequency_IDentification) tags which exchange information on a non-contact basis with external equipment exemplified by a reader-writer. As a type of RFID tag, there have been proposed devices which have a conductor pattern (hereinafter referred to simply as an antenna) which, being formed on a base sheet made of plastics or paper, functions as an antenna for radio communications and an IC chip which, being electrically connected with the antenna, conducts wireless communications via the antenna (see, for example, Japanese Patent Application Publication Nos. 2000-311226, 2000-200332, and 2001-351082). Possibly, this type of RFID tag can be used for identification of goods by being attached to the goods and exchanging information about the goods with external equipment.

Figure 1:
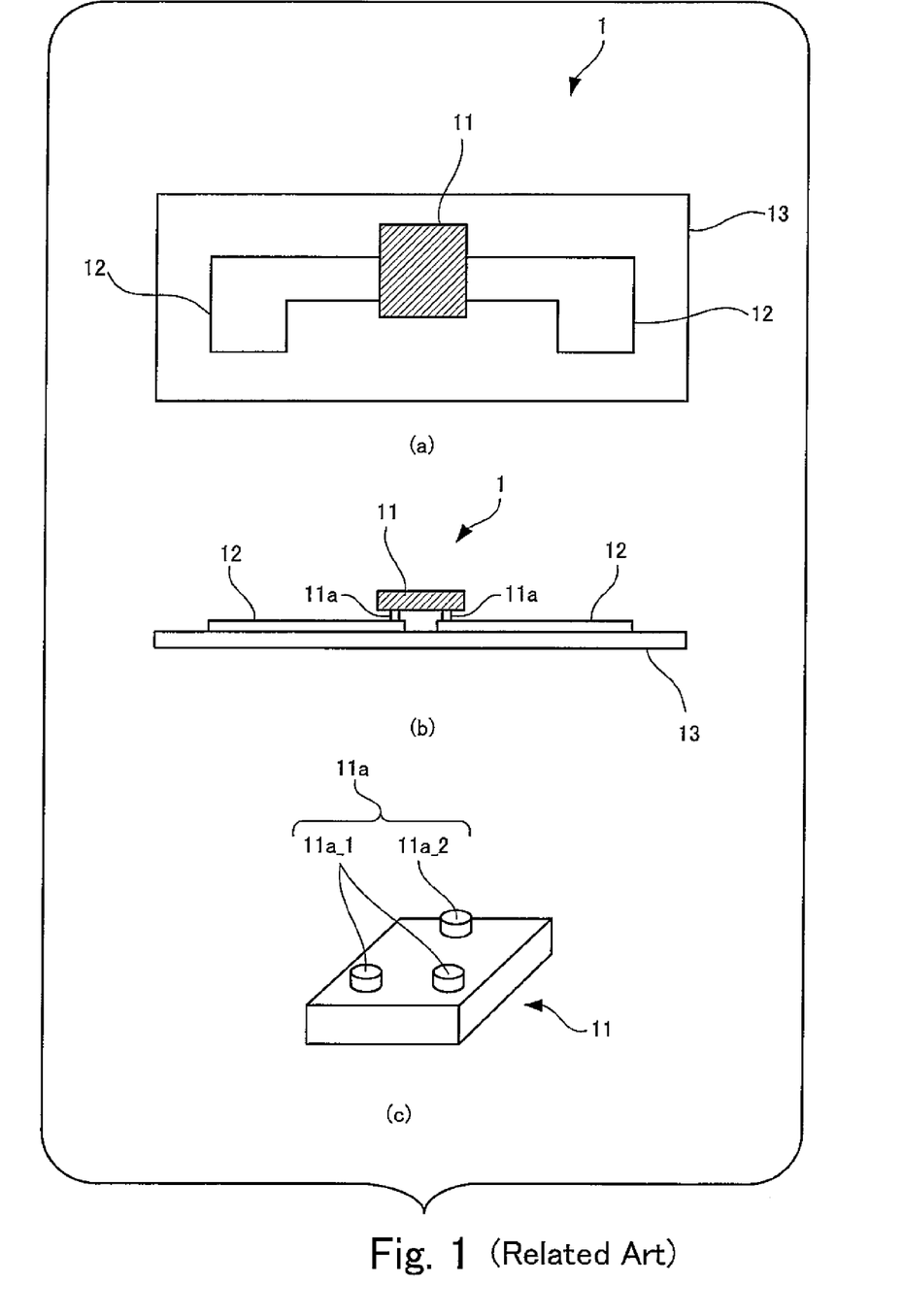

FIG. 1 shows an example of a RFID tag.

Part (a) of FIG. 1 shows a top view of an RFID tag 1, Part (b) of FIG. 1 shows a side view of the RFID tag 1 in a longitudinal direction, and Part (c) of FIG. 1 shows an IC chip 11 which is a component of the RFID tag 1. Incidentally, the IC chip 11 uses bumps 11a made of gold or the like as connection terminals, and Part (c) of FIG. 1 shows the bumps 11a upside down compared to Parts (a) and (b) of FIG. 1 to provide a view of a surface on which the bumps 11a are formed.

The RFID tag 1 shown in FIG. 1 includes an antenna 12 formed on a sheet-type base 13 made of a PET film or the like, and an IC chip 11 electrically connected with the antenna 12 via the bumps 11a and bonded to the base 13 with an adhesive.

The IC chip 11 of the RFID tag 1 can communicate and exchange information with external equipment via the antenna 12.

In the example of FIG. 1, the antenna 12 of the RFID tag 1 has a point-asymmetrical shape with two L-shaped patterns placed on both sides of the IC chip 11. In the example of FIG. 1, out of the three bumps 11a shown in Part (c) of FIG. 1, the two bumps 11a_1 are connected to ends of long sides of the respective L-shaped patterns of the antenna 12. Furthermore, in the example of FIG. 1, the IC chip 11 is mounted on the antenna 12 in such an orientation that the remaining one bump 11a_2 will be located opposite to a projecting direction of short sides of the L-shaped patterns of the antenna 12. In this way, in the example of FIG. 1, the IC chip 11 is mounted in an orientation which depends on the projecting direction of the short sides of the L-shaped patterns of the antenna 12 (hereinafter the projecting direction of the short sides will be referred to as orientation of the antenna 12).

As shown in FIG. 1, typical RFID tags include those which have a point-asymmetrical antenna and on which an IC chip is mounted according to the orientation of the antenna. Ingenuity such as described below has been exercised in manufacturing RFID tags equipped with such a point-asymmetrical antenna.

Figure 2:
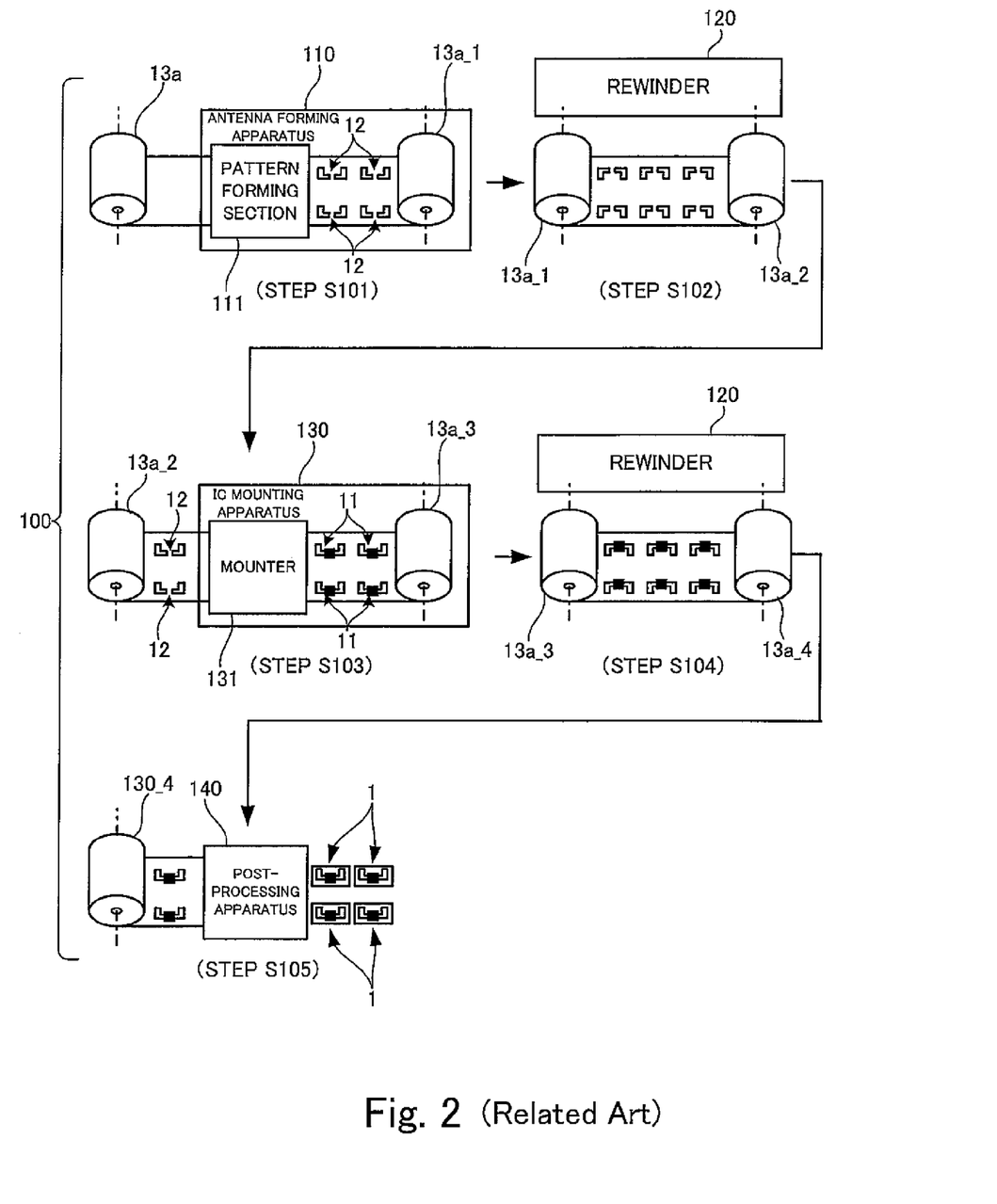
FIG. 2 is a diagram showing an example of a tag manufacturing system which manufactures RFID tags equipped with a point-asymmetrical antenna.

FIG. 2 is a diagram showing an example of a tag manufacturing system which manufactures RFID tags equipped with a point-asymmetrical antenna.

Incidentally, the RFID tag manufactured in the example in FIG. 2 is the RFID tag 1 shown in FIG. 1.

The tag manufacturing system 100 shown in FIG. 2 manufactures multiple units of the RFID tag 1 using a base roll 13a produced by rolling up a long base sheet large enough to place multiple bases 13.

The tag manufacturing system 100 is equipped with an antenna forming apparatus 110 which performs an antenna forming process (step S101) described below. In the antenna forming process (step S101), first the base roll 13a is loaded on the antenna forming apparatus 110. Then, a pattern forming section 111 of the antenna forming apparatus 110 pulls the base sheet out of the base roll 13a and forms multiple antennas 12 on the base sheet. The pattern forming section 111 places the multiple antennas 12 in two rows on the base sheet by aligning orientations of antenna patterns as shown in FIG. 2. The base sheet with the antennas formed by the pattern forming section 111 is wound by a winding section (not shown) to produce an antenna-bearing roll body 13a_1. Consequently, the base sheet with the antennas formed is delivered to a next process in the form of a roll body which is easy to handle.

Also, the tag manufacturing system 100 is equipped with an IC mounting apparatus 130 which performs an IC chip mounting process (step S103) for mounting an IC chip 11 on each antenna 12 on the base sheet. The IC mounting apparatus 130 in turn is equipped with a mounter 131 which mounts the IC chips 11 on the antennas 12. The mounter 131 is set to mount the IC chips 11 on the antennas in the same orientation as the antennas 12 formed by the pattern forming section 111. This simplifies system architecture. If the antenna-bearing roll body 13a_1 produced by the antenna forming apparatus 110 were loaded as it was on the IC mounting apparatus 130, the antenna-bearing roll body 13a_1 would be turned 180 degrees during the loading, and consequently the orientation of the antennas 12 on the base sheet pulled out of the antenna-bearing roll body 13a_1 would be 180 degrees opposite to the orientation of the antennas 12 on which the IC chips 11 could be mounted by the mounter 131.

To eliminate this inconsistency, the tag manufacturing system 100 is equipped with a rewinder 120 which rewinds the roll body, and after the antenna forming process (step S101), a rewind process (step S102) is performed to rewind the antenna-bearing roll body 13a_1 and thereby obtain an antenna-bearing rewound roll body 13a_2. The orientation of the antennas 12 on the base sheet pulled out of the antenna-bearing rewound roll body 13a_2 coincides with the orientation of the antennas 12 on which the IC chips 11 can be mounted by the mounter 131. This makes it possible to mount the IC chips 11 normally in the IC chip mounting process (step S103).

Also, the tag manufacturing system 100 is equipped with a post-processing apparatus 140 which performs a post-process (step S105) for working up the base sheet on which the IC chips have been mounted into finished RFID tags 1 by sealing, cutting, and the like. To simplify system architecture, as in the case of the mounter 131, the post-processing apparatus 140 is set to perform post-processing of the base sheet on which the antennas 12 are arranged in the orientation in which they are formed by the pattern forming section 111. Then, the IC mounting apparatus 130 winds the base sheet and thereby obtains an IC-chip-carrying roll body 13a_3 to make it easy to deliver the base sheet on which the IC chips have been mounted to a next process, as in the case of the antenna forming apparatus 110. For this reason, after the IC chip mounting process (step S103), a rewind process (step S104) is performed to rewind the IC-chip-carrying roll body 13a_3 by means of the rewinder 120 and thereby obtain an IC-chip-carrying rewound roll body 13a_4.

In this way, in the tag manufacturing system shown in FIG. 2, the antennas are arranged in the same orientation when handled by the pattern forming section 111, IC mounting apparatus 130, and post-processing apparatus 140, to simplify system architecture. Furthermore, the base sheet is delivered in the form of a roll body between manufacturing processes for ease of delivery, and the inconsistency arising as a result is eliminated by the rewind process performed by the rewinder 120.

However, rewind processes such as described above are troublesome for users and cause operation delays during manufacture of RFID tags 1. Also, an increased number of rewind processes will increase loads on the antennas 12 or IC chips 11 on the base sheet and may cause problems such as separation of IC chips 11 or breakage of antennas 12 and IC chips 11.

Although problems which may be caused by an increased number of rewind processes during manufacture has been described by taking RFID tags as an example, these problems are common to electronic devices which include a conductor pattern formed on a base such as a printed circuit board and a circuit chip electrically connected to the conductor pattern.

SUMMARY OF THE INVENTION

The present invention has been made in view of the above circumstances and provides an electronic device manufacturing system and electronic device manufacturing method which can manufacture electronic devices using a reduced number of rewind processes.

The present invention provides an electronic device manufacturing system that manufactures electronic devices each of which includes a base, a conductor pattern formed into a point-asymmetrical shape on the base, and a circuit chip electrically connected to the conductor pattern, the electronic device manufacturing system including:

a conductor pattern forming apparatus which forms multiple conductor patterns in such a way that at least some of the multiple conductor patterns are formed in a point-symmetrical arrangement including conductor pattern orientations, on a long base sheet large enough to place multiple bases, and winds the base sheet into a roll body;

a circuit chip mounting apparatus which pulls the base sheet out of the roll body, mounts the circuit chip on each of the conductor patterns formed on the pulled base sheet in an orientation corresponding to an orientation of the each conductor pattern, and electrically connects the circuit chip with the conductor pattern; and a post-processing apparatus which performs post-processing of the base sheet with the circuit chips mounted on the conductor patterns by the circuit chip mounting apparatus, to work up the base sheet into finished electronic devices.

The "point-symmetrical arrangement" mentioned above may be an arrangement of all the conductor patterns on the base sheet or an arrangement of some of the conductor patterns on the base sheet. Alternatively, multiple "point-symmetrical arrangements" may be formed on the base sheet.

With the electronic device manufacturing system according to the present invention, the conductor pattern forming apparatus produces the roll body to make it easy to deliver the base sheet to a next process, and the roll body is handled as it is by the circuit chip mounting apparatus which undertakes a downstream manufacturing process. The roll body is turned 180 degrees when it is delivered from the pattern forming apparatus to the circuit chip mounting apparatus, and the point-symmetrical arrangement remains the same after the turn. Thus, the base sheet on which the point-symmetrical arrangement is formed does not need the rewind process when it is delivered from the pattern forming apparatus to the circuit chip mounting apparatus. The elimination of the need for the rewind process leads to reduction in loads on the conductor patterns. In this way, the electronic device manufacturing system according to the present invention can manufacture electronic devices such as RFID tags using a reduced number of rewind processes.

In the electronic device manufacturing system according to the present invention, preferably:

the circuit chip mounting apparatus winds the base sheet, with the circuit chips mounted on the conductor patterns, to produce the roll body; and the post-processing apparatus performs the post-processing of the base sheet by pulling the base sheet out of the roll body produced by the circuit chip mounting apparatus.

With the preferred form of the electronic device manufacturing system, the base sheet is delivered from the circuit chip mounting apparatus to the post-processing apparatus also in the form of the roll body for ease of delivery and the base sheet on which the point-symmetrical arrangement is formed does not need the rewind process. Consequently, the preferred form of the electronic device manufacturing system makes it possible to manufacture electronic devices without using any rewind process. The total elimination of the need for a rewind process makes it possible to avoid problems such as separation of IC chips or breakage of conductor patterns and IC chips which would be caused by the rewind processes.

Also, in the electronic device manufacturing system according to the present invention, preferably the circuit chip mounting apparatus includes a chip transport section which holds the circuit chips, orients the held circuit chips according to the orientations of the respective conductor patterns, and transports the circuit chips onto the conductor patterns.

With the preferred form of the electronic device manufacturing system, it is possible to mount the circuit chips reliably on a regular point-symmetrical arrangement of multiple conductor patterns which differ in orientation.

Also, in the electronic device manufacturing system according to the present invention, preferably:

the conductor pattern forming apparatus forms the conductor patterns by arranging the conductor patterns regularly in multiple predetermined orientations, respectively; and the circuit chip mounting apparatus includes:

a disposing section in which multiple circuit chip groups corresponding, respectively, to the multiple orientations of the conductor patterns are disposed, with the circuit chips in each of the circuit chip groups having an orientation corresponding to the orientation assigned to the given circuit chip group; and a chip transport section which transports the circuit chips in each of the multiple circuit chip groups in the disposing section onto the conductor patterns which have the same orientation as the orientation assigned to the given circuit chip group.

With the preferred form of the electronic device manufacturing system, by storing circuit chip groups corresponding, respectively, to the multiple orientations in the disposing section, it is possible to mount the circuit chips reliably on a regular point-symmetrical arrangement of multiple conductor patterns which differ in orientation.

Also, in the electronic device manufacturing system according to the present invention, the electronic devices may be RFID tags which conduct wireless communications using the circuit chip with the conductor pattern functioning as a communications antenna.

This aspect makes it possible to manufacture RFID tags using a reduced number of rewind processes.

Also, the present invention provides an electronic device manufacturing method for manufacturing electronic devices each of which includes a base, a conductor pattern formed into a point-asymmetrical shape on the base, and a circuit chip electrically connected to the conductor pattern, the electronic device manufacturing method including:

a conductor pattern forming step of forming multiple conductor patterns in such a way that at least some of the multiple conductor patterns are formed in a point-symmetrical arrangement including conductor pattern orientations, on a long base sheet large enough to place multiple bases, and winding the base sheet into a roll body;

a circuit chip mounting step of pulling the base sheet out of the roll body, mounting the circuit chip on each of the conductor patterns formed on the pulled base sheet in an orientation corresponding to an orientation of the each conductor pattern, and electrically connecting the circuit chip with the conductor pattern; and a post-processing step of performing post-processing of the base sheet with the circuit chips mounted on the conductor patterns by the circuit chip mounting step, to work up the base sheet into finished electronic devices.

The electronic device manufacturing method according to the present invention makes it possible to manufacture electronic devices using a reduced number of rewind processes.

In the electronic device manufacturing method according to the present invention, preferably:

the circuit chip mounting step winds the base sheet, with the circuit chips mounted on the conductor patterns, to produce the roll body; and the post-processing step performs the post-processing of the base sheet by pulling the base sheet out of the roll body produced by the circuit chip mounting step.

Also, in the electronic device manufacturing method according to the present invention, preferably the circuit chip mounting step includes holding the circuit chips, orienting the held circuit chips according to the orientations of the respective conductor patterns, and transporting the circuit chips onto the conductor patterns.

Also, in the electronic device manufacturing method according to the present invention, preferably:

the conductor pattern forming step forms the conductor patterns by arranging the conductor patterns regularly in multiple predetermined orientations, respectively; and from a disposing section in which multiple circuit chip groups corresponding, respectively, to the multiple orientations of the conductor patterns are disposed, with the circuit chips in each of the multiple circuit chip groups having an orientation corresponding to the orientation assigned to the given circuit chip group, the circuit chip mounting step transports the circuit chips in each of the multiple circuit chip groups onto the conductor patterns which have the same orientation as the orientation assigned to the given circuit chip group.

Also, in the electronic device manufacturing method according to the present invention, the electronic devices may be RFID tags which conduct wireless communications using the circuit chip with the conductor pattern functioning as a communications antenna.

As described above, the present invention makes it possible to manufacture the electronic devices using a reduced number of rewind processes.

BRIEF DESCRIPTION OF THE DRAWINGS

Parts (a) and (b) of FIG. 1 are diagrams showing an example of a RFID tag.

DETAILED DESCRIPTION OF THE INVENTION

Embodiments of the present invention will be described with reference to the drawings.

Figure 3:
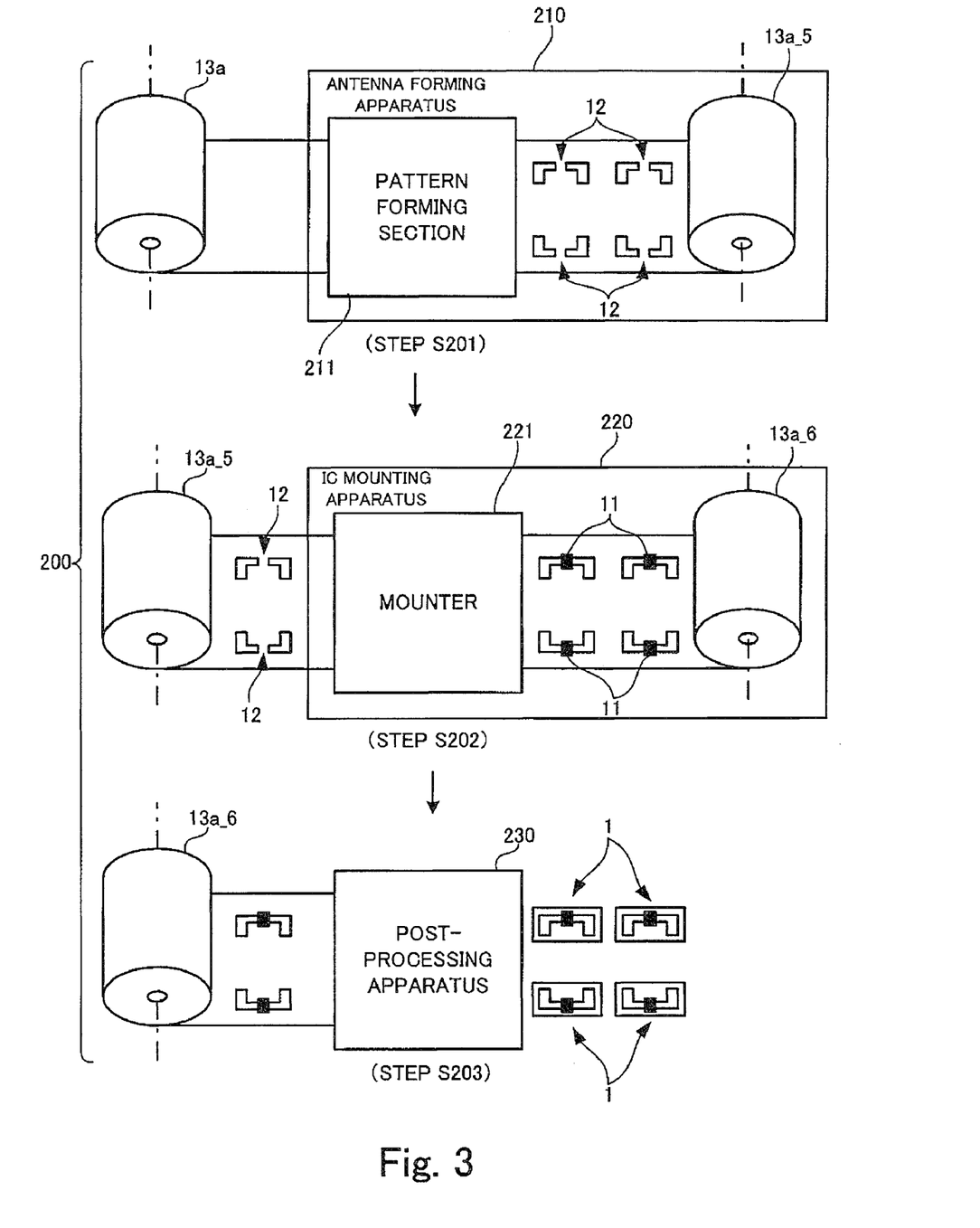
FIG. 3 is a diagram showing an example of a tag manufacturing system which is an embodiment of the present invention.

FIG. 3 is a diagram showing an example of a tag manufacturing system which is an embodiment of the present invention.

The tag manufacturing system 200 shown in FIG. 3 is an embodiment of the electronic device manufacturing system according to the present invention and a series of processes (described later) performed by the tag manufacturing system 200 is an embodiment of the electronic device manufacturing method according to the present invention.

As in the case of the tag manufacturing system 100 shown in FIG. 2, the tag manufacturing system 200 manufactures the RFID tag 1 (see FIG. 1) equipped with an antenna of a point-asymmetrical shape using a base roll 13a produced by rolling up a long base sheet large enough to place multiple bases 13. It includes an antenna forming apparatus 210, IC mounting apparatus 220, and post-processing apparatus 230. The RFID tag 1 manufactured by the tag manufacturing system 200 shown in FIG. 3 is an example of the electronic device according to the present invention and the antenna 12 contained in the RFID tag 1 is an example of the conductor pattern according to the present invention. Besides, the L-shaped pattern (shown in FIG. 1) of the antenna 12 is an example of the point-asymmetrical shape according to the present invention.

The antenna forming apparatus 210 performs an antenna forming process (step S201) described below and is an example of conductor pattern forming apparatus according to the present invention. On the other hand, the antenna forming process (step S201) performed by the antenna forming apparatus 210 is an example of the conductor pattern forming step according to the present invention.

The antenna forming apparatus 210 includes a pattern forming section 211. When a base roll 13a is loaded onto the antenna forming apparatus 210, first the pattern forming section 211 pulls the base sheet out of the base roll 13a and forms multiple antennas 12 on the base sheet. According to this embodiment, the pattern forming section 211 has an arrangement rule according to which two antennas 12 are arranged in such a way that long sides of L-shaped patterns extend along the longitudinal direction of the base sheet and that short sides project facing each other as shown in FIG. 3. Thus, the pattern forming section 211 forms multiple antennas in a point-symmetrical arrangement according to this arrangement rule. The arrangement of the two antennas 12 facing each other is an example of the point-symmetrical arrangement according to the present invention, and an arrangement of multiple pairs of such antennas 12, i.e., the arrangement of all the antennas 12 on the base sheet, is also an example of the point-symmetrical arrangement according to the present invention. The base sheet with the antennas formed by the pattern forming section 211 is subsequently wound by a winding section (not shown) to produce an antenna-bearing roll body 13a_5 for ease of delivery of the base sheet.

Incidentally, although an arrangement of two antennas 12 in which the long sides of L-shaped patterns extend along the longitudinal direction of the base sheet and the short sides project facing each other has been taken as an example of the point-symmetrical arrangement of antennas 12 with L-shaped patterns according to the present invention, the present invention is not limited to this. The point-symmetrical arrangement of antennas 12 with L-shaped patterns according to the present invention may be an arrangement such as described below.

Figure 4:
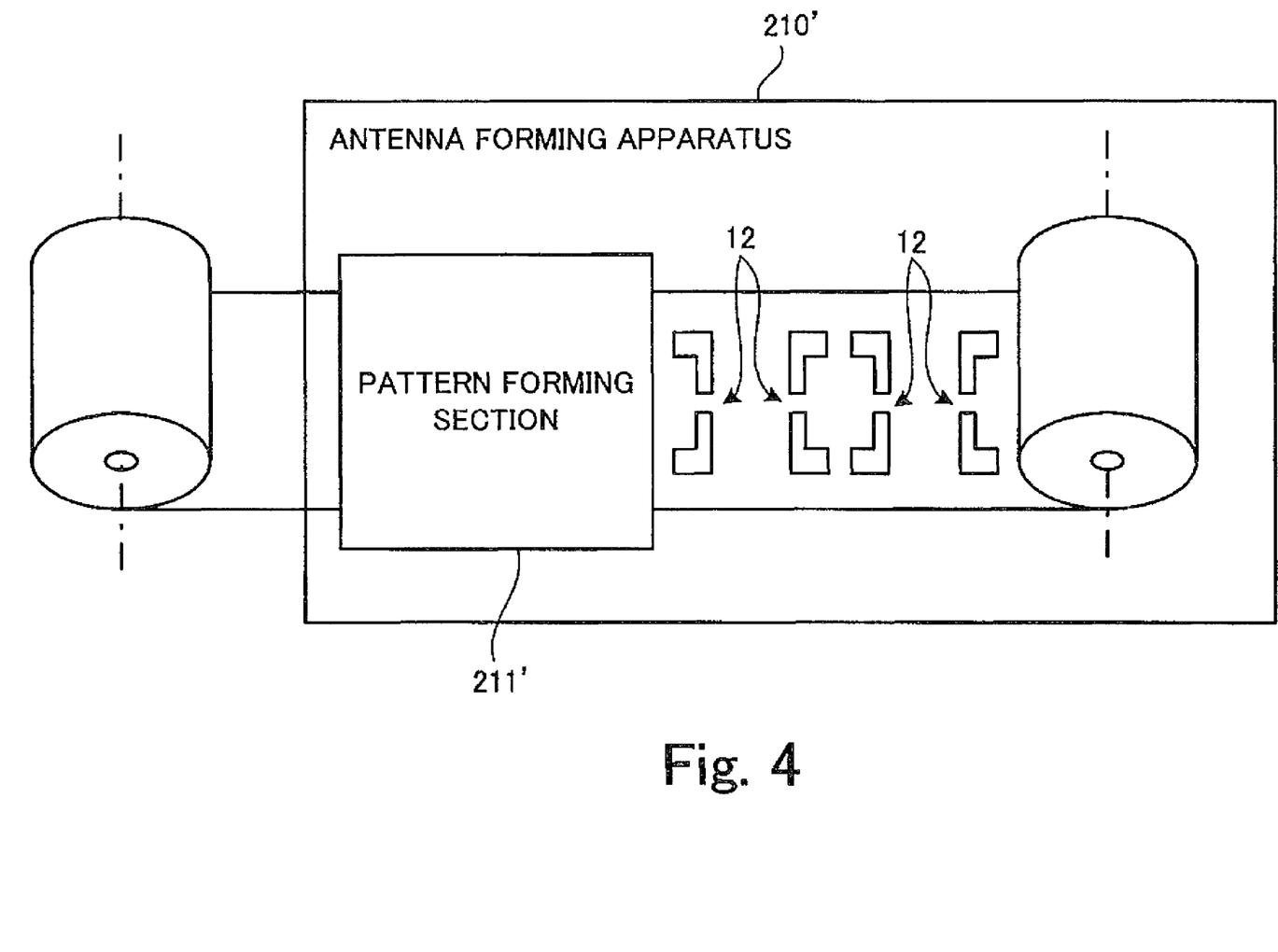
FIG. 4 is a diagram showing another example of a point-symmetrical arrangement.

FIG. 4 is a diagram showing another example of the point-symmetrical arrangement.

FIG. 4 shows another antenna forming apparatus 210' which forms antennas in an arrangement different from the point-symmetrical arrangement shown in FIG. 3. A pattern forming section 211' of the antenna forming apparatus 210' forms two antennas 12 with L-shaped patterns in such a way that the long sides of the L-shaped patterns extend orthogonally to the longitudinal direction of the base sheet and that the short sides project facing each other as shown in FIG. 4. The arrangement of the two antennas 12 shown in FIG. 4 is another example of the point-symmetrical arrangement according to the present invention, and an arrangement of multiple pairs of such antennas 12, i.e., the arrangement of all the antennas 12 on the base sheet, is also an example of the point-symmetrical arrangement according to the present invention.

This concludes description of the other example of the point-symmetrical arrangement, and description of the tag manufacturing system 200 according to the present embodiment will be continued by returning to FIG. 3.

The IC mounting apparatus 220 shown in FIG. 3 performs an IC chip mounting process (step S202) to mount IC chips 11 to each antenna 12 on the base sheet. The IC mounting apparatus 220 is an example of the circuit chip mounting apparatus according to the present invention. The mounting process (step S202) performed by the IC mounting apparatus 220 is an example of the circuit chip mounting step according to the present invention.

The IC mounting apparatus 220 is equipped with a mounter 221. When the antenna-bearing roll body 13a 5 is loaded on the IC mounting apparatus 220, first the mounter 221 pulls the base sheet out of the antenna-bearing roll body 13a_5 and mounts an IC chip 11 on each antenna 12 on the base sheet. The mounter 221 is equipped with a disposing section (not shown) which disposes IC chip groups arranged in a single orientation and a chip transport section 222 (described below; see FIG. 5) which transports the IC chips 11 from the disposing section to the respective antennas 12.

Figure 5:
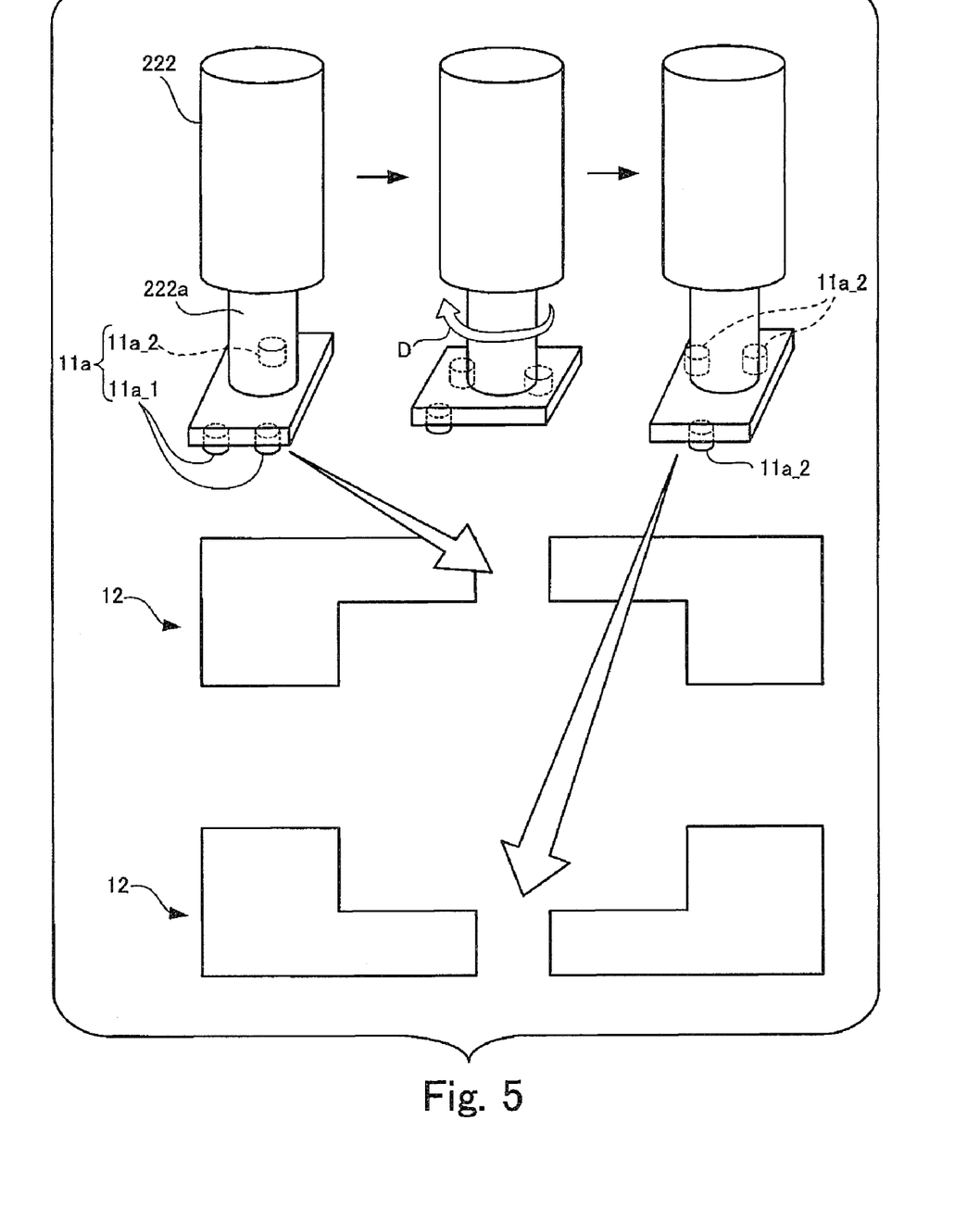
FIG. 5 is a diagram showing a chip transport section.

FIG. 5 is a diagram showing the chip transport section 222.

As described above, in the RFID tag 1 manufactured by the tag manufacturing system 200 according to this embodiment, the IC chip 11 is mounted on the antenna 12 in such an orientation that the two bumps 11a_1 out of the three bumps 11a are connected to the ends of the long sides of the respective L-shaped patterns of the antenna 12 while the remaining one bump 11a_2 is located opposite to the projecting direction of the short sides of the L-shaped patterns of the antenna 12. According to this embodiment, the antennas 12 placed in a point-symmetrical arrangement differ from each other in the orientation which coincides with the projecting direction of the short sides of the L-shaped patterns as described above, and each of the antennas 12 on the base sheet coincides with one of the two orientations accordingly.

Thus, the chip transport section 222 shown in FIG. 5 has a tip section 222a which, being rotatable in the direction of arrow D in FIG. 5, holds each IC chip 11, directs the held IC chip 11 in one of the two orientations described above, and transports the IC chip 11 onto the antenna 12 corresponding to the given orientation. The chip transport section 222 is an example of the "the chip transport section which holds the circuit chips, orients the held circuit chips according to the orientations of the respective conductor patterns, and transports the circuit chips onto the conductor patterns" according to the present invention.

According to this embodiment, in the disposing section (not shown), IC chip groups are disposed with an orientation corresponding to the orientation of the antennas 12 in the upper of the two rows of antennas 12 in FIG. 5. The chip transport section 222 transports IC chips 11 to the antennas 12 in the upper row, maintaining the orientation in which they are held in the disposing section, i.e., keeping the one bump 11a_2 on the side opposite the projecting direction of the short sides of the antennas 12 in the upper row. Regarding the antennas 12 in the lower row, before transporting IC chips 11, the chip transport section 222 which holds the IC chips 11 turns the tip section 222a by 180 degrees in the direction of arrow D and thereby orients the IC chips 11 in such a way as to place the tip section 222a on the side opposite the projecting direction of the short sides of the antennas 12 in the lower row. In this way, according to this embodiment, after holding the IC chips 11, the chip transport section 222 turns the tip section 222a appropriately and thereby orients the IC chips 11 according to the orientations of the respective antennas 12 before transporting the IC chips 11. This makes it possible to mount the IC chip 11 on each of multiple antennas 12 in the orientation corresponding to the orientation of the given antenna 12 when the multiple antennas 12 are arranged in two different orientations on the base sheet.

In the IC mounting apparatus 220 in FIG. 3, transport operation of the chip transport section 222 in FIG. 5 including movements of the tip section 222a is specified in advance based on the arrangement rule followed by the pattern forming section 211 during antenna formation. Also, according to this embodiment, the antenna-bearing roll body 13a_5 produced by the antenna forming apparatus 210 is loaded onto the IC mounting apparatus 220 after being turned 180 degrees. In so doing, if the arrangement of the antennas 12 on the base sheet pulled out of the antenna-bearing roll body 13a_5 loaded onto the IC mounting apparatus 220 including the orientations of the antennas 12 do not conform to the arrangement rule, inconsistency can occur during the mounting of the IC chips 11. However, according to this embodiment, since the arrangement of the antennas 12 on the base sheet is point-symmetrical, even if a 180-degree turn is made before loading onto the IC mounting apparatus 220, the arrangements before and after the 180-degree turn coincide, making it possible to avoid the inconsistency described above. Thus, this embodiment eliminates the need for the rewind process when delivering the antenna-bearing roll body 13a_5 and thereby allows the delivery to be performed smoothly.

Incidentally, although the IC mounting apparatus 220 equipped with the mounter 221 which has the chip transport section 222 with the rotatable tip section 222a has been taken as an example of the circuit chip mounting apparatus according to the present invention, the present invention is not limited to this and the chip mounting apparatus according to the present invention may be equipped with a mounter such as described below.

Figure 6:
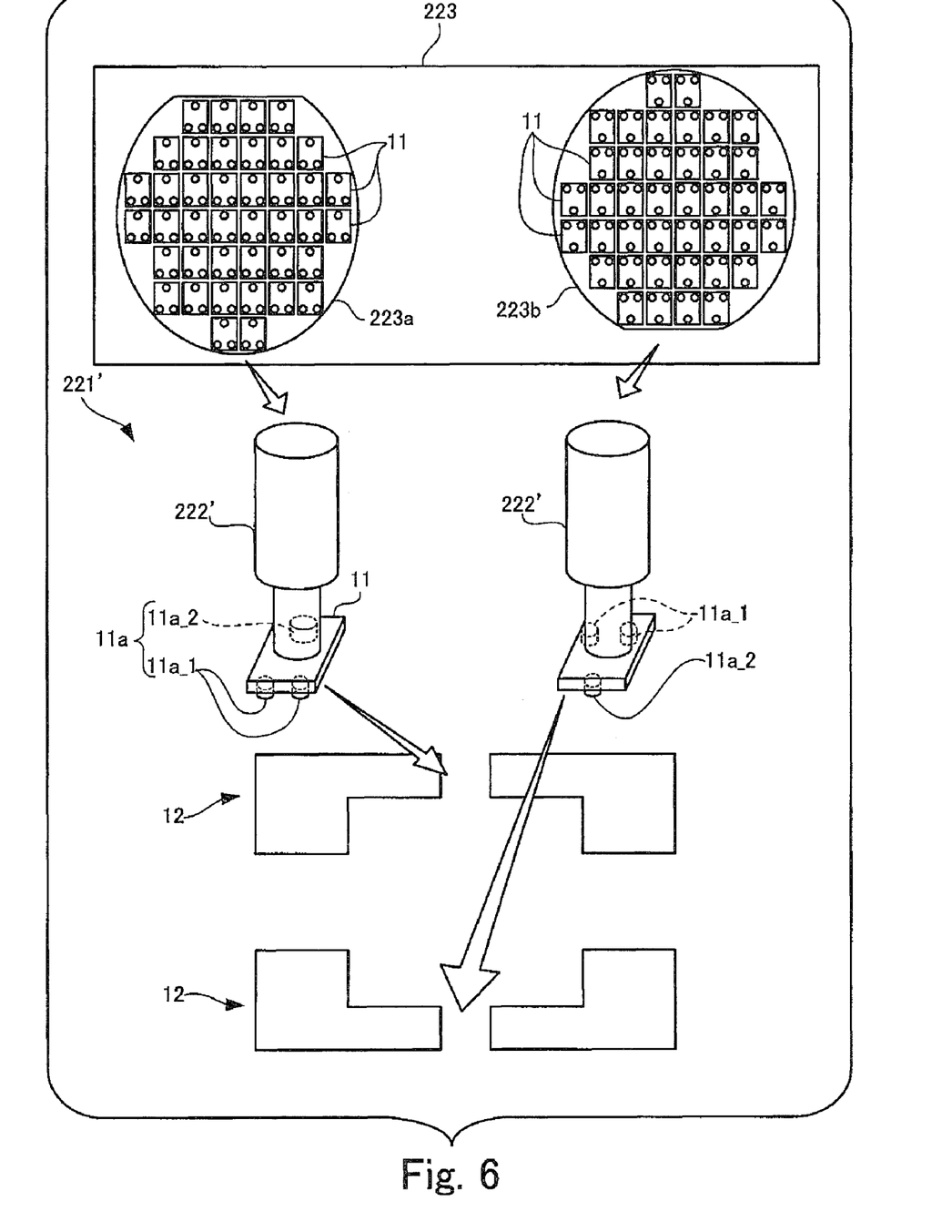
FIG. 6 is a diagram showing another example of a mounter.

FIG. 6 is a diagram showing another example of a mounter.

The mounter 221' shown in FIG. 6 is equipped with a disposing section 223 in which two wafers with the IC chips 11 formed are disposed. A first wafer 223a of the two wafers is disposed in the disposing section 223 in such an orientation that the IC chips 11 can be mounted as they are on one of the two types of antenna 12 facing different directions on the base sheet. On the other hand, a second wafer 223b of the two wafers is disposed in the disposing section 223 in such an orientation that the IC chips 11 can be mounted as they are on the other of the two types of antenna 12, i.e., in the orientation opposite to the orientation of the IC chips 11 on the first wafer 223a. The disposing section 223 is an example of the disposing section according to the present invention and the first and second wafers 223a and 223b are examples of circuit chip groups according to the present invention. Also, the mounter 221' shown in FIG. 6 is equipped with a chip transport section 222' which transports the IC chips 11 on each wafer disposed in the disposing section 223 to the antennas 12 which have the same orientation as the orientation assigned to the given wafer while maintaining the orientation of the IC chips on the wafer. The chip transport section 222' is an example of the "chip transport section which transports the circuit chips in each of the multiple circuit chip groups onto the conductor patterns which have the same orientation as the orientation assigned to the given circuit chip group" according to the present invention.

In the example in FIG. 6, the first wafer 223a corresponds to the orientation of the upper of the two rows of antennas 12 in the figure while the second wafer 223b corresponds to the orientation of the lower of the two rows of antennas 12 in the figure. The chip transport section 222' transports the IC chips 11 on the first wafer 223a to the antennas 12 in the upper row by maintaining the orientation of the IC chips 11 as they are, i.e., keeping the one bump 11a_2 on the side opposite the projecting direction of the short sides of the antennas 12 in the upper row. Regarding the antennas 12 in the lower row, the chip transport section 222' transports the IC chips 11 on the second wafer 223b by maintaining their orientation as they are, i.e., keeping the one bump 11a_2 on the side opposite the projecting direction of the short sides of the antennas 12 in the lower row. In this way, in the mounter 221', the chip transport section 222' transports the IC chips 11 from the wafers corresponding to the orientations of the respective antennas 12. Consequently, again the mounter 221' mounts the IC chip 11 on each of multiple antennas 12 in the orientation corresponding to the orientation of the given antenna 12 when the multiple antennas 12 are arranged in two different orientations on the base sheet. Also, in this example, placement of the wafers in the disposing section 223 and operation of the chip transport section 222' are determined in advance according to the arrangement rule.

Although in the other example, the chip transport section 222' taken as an example of the chip transport section according to the present invention transports the IC chips 11 in the orientation in which they are disposed in the disposing section 223 by transporting them from the disposing section 223 to the antennas, the present invention is not limited to this. The chip transport section according to the present invention may be, for example, a type which includes a rotatable arm and a tip section which, being installed at a tip of the arm, holds the IC chips 11, in which the tip section moves between the disposing section 223 and antennas along with rotation of the arm. In that case, the two wafers are disposed in the disposing section 223 in such a way that the IC chips on the respective wafers are offset by the arm's rotation angle from the orientation in which they can be mounted on the antenna.

This concludes description of the other example of the mounter, and description of the tag manufacturing system 200 according to the present embodiment will be continued by returning to FIG. 3.

When the IC chips 11 are mounted by the mounter 221 as described above, the base sheet with the IC chips mounted is subsequently wound by a winding section (not shown) to produce an IC-chip-carrying roll body 13a_6 for ease of delivery.

As is the case with the delivery of the antenna-bearing roll body 13a_5, the IC-chip-carrying roll body 13a_6 is turned 180 degrees before delivery and loading onto the post-processing apparatus 230.

The post-processing apparatus 230 pulls the base sheet on which the IC chips 11 have been mounted on the antennas 12 out of the loaded IC-chip-carrying roll body 13a_6 and performs a post-process (step S203) for working up the base sheet into finished RFID tags 1 by a predetermined sealing process and cutting process. The post-processing apparatus 230 is an example of the post-processing apparatus according to the present invention and a series of processes (step S203) performed by the post-processing apparatus 230 is an example of the post-processing step according to the present invention.

According to this embodiment, the sealing process is performed for each core section of the RFID tag 1, where the core section is composed of the antenna 12 and IC chip 11. The cutting process cuts off the core sections after sealing from each other to obtain multiple RFID tags 1. According to this embodiment, sealing positions on the base sheet, cutting positions on the base sheet, and the like are set in advance according to the arrangement rule. Thus, the arrangement of the core sections on the base sheet pulled out by the post-processing apparatus 230 including the orientations of the antennas 12 can cause inconsistency during the post-process if it does not conform to the arrangement rule. However, according to this embodiment, since the arrangement of the antennas 12 on the base sheet, and thus the arrangement of core sections, is point-symmetrical, even if the IC-chip-carrying roll body 13a_6 is turned 180 degrees when it is loaded onto the post-processing apparatus 230, the arrangements before and after the 180-degree turn coincide, making it possible to avoid the inconsistency described above. Thus, this embodiment eliminates the need for the rewind process when delivering the IC-chip-carrying roll body 13a_6 and thereby allows the delivery to be performed smoothly. Besides, since this embodiment totally eliminates the need for a rewind process after all, it can avoid problems such as separation of IC chips 11 or breakage of antennas 12 and IC chips 11 which would be caused by the rewind processes.

As described above, the tag manufacturing system 200 according to this embodiment can manufacture RFID tags without using any rewind process.

Incidentally, although a tag manufacturing system which manufactures RFID tags has been illustrated as an embodiment of the electronic device manufacturing system according to the present invention and a series of processes for manufacturing RFID tags has been illustrated as an embodiment of the electronic device manufacturing method according to the present invention, the present invention is not limited to this. It is essential for the electronic device manufacturing system according to the present invention only to manufacture electronic devices each of which includes a circuit chip electrically connected to a conductor pattern formed on a base such as a printed circuit board, and for the electronic device manufacturing method according to the present invention only to manufacture the electronic devices. For example, the electronic device manufacturing system according to the present invention may manufacture ultrathin IC cards or may manufacture printed circuit board devices with circuit chips fixed to conductor patterns which are formed on a flexible substrate. Also, the electronic device manufacturing method according to the present invention may be a method for manufacturing such ultrathin IC cards or printed circuit board devices.

Also, although an L-shaped pattern has been taken as an example of the point-asymmetrical shape in the antenna of the RFID tag according to the present invention, the present invention is not limited to this. The point-asymmetrical shape according to the present invention may be any other pattern shape as long as it is point-asymmetrical.

Also, although the tag manufacturing system 200 illustrated as an embodiment of the electronic device manufacturing system according to the present invention produces the IC-chip-carrying roll body 13*a*_6 by winding a base sheet on which the IC chips 11 have been mounted and delivers it to an apparatus which performs post-processing, the present invention is not limited to this. The electronic device manufacturing system according to the present invention may perform post-processing of the base sheet immediately without winding the base sheet on which the IC chips 11 have been mounted.

Also, although the post-processing apparatus 230 which performs a sealing process and cutting process has been taken as an example of the post-processing apparatus according to the present invention, the present invention is not limited to this. The post-processing apparatus according to the present invention may perform one of the sealing process and cutting process or perform a process other than the sealing process and cutting process.

What is claimed is:

1. An electronic device manufacturing system that manufactures electronic devices each of which includes a base, a conductor pattern formed into a point-asymmetrical shape alternately on the base, and a circuit chip electrically connected to the conductor pattern, the electronic device manufacturing system comprising: a conductor pattern forming apparatus which forms a plurality of the conductor patterns in such a way that at least some of the plurality of the conductor patterns are formed in a point-symmetrical arrangement including conductor pattern orientations, on a long base sheet large enough to place a plurality of the bases, and winds the base sheet into a roll body; a circuit chip mounting apparatus which pulls the base sheet out of the roll body, mounts the circuit chip on each of the conductor patterns formed on the pulled base sheet in an orientation corresponding to an orientation of the each conductor pattern, and electrically connects the circuit chip with the conductor pattern; and a post-processing apparatus which performs post-processing of the base sheet with the circuit chips mounted on the conductor patterns by the circuit chip mounting apparatus, to work up the base sheet into finished electronic devices.

2. The electronic device manufacturing system according to claim 1, wherein:
the circuit chip mounting apparatus winds the base sheet, with the circuit chips mounted on the conductor patterns, to produce the roll body; and
the post-processing apparatus performs the post-processing of the base sheet by pulling the base sheet out of the roll body produced by the circuit chip mounting apparatus.

3. The electronic device manufacturing system according to claim 1, wherein the circuit chip mounting apparatus includes a chip transport section which holds the circuit chips, orients the held circuit chips according to the orientations of the respective conductor patterns, and transports the circuit chips onto the conductor patterns.

4. The electronic device manufacturing system according to claim 1, wherein:
the conductor pattern forming apparatus forms the conductor patterns by arranging the conductor patterns regularly in a plurality of predetermined orientations, respectively; and
the circuit chip mounting apparatus comprises:
a disposing section in which a plurality of circuit chip groups corresponding, respectively, to the plurality of orientations of the conductor patterns are disposed, with the circuit chips in each of the circuit chip groups having an orientation corresponding to the orientation assigned to the given circuit chip group; and
a chip transport section which transports the circuit chips in each of the plurality of circuit chip groups in the disposing section onto the conductor patterns which have the same orientation as the orientation assigned to the given circuit chip group.

5. The electronic device manufacturing system according to claim 1, wherein the electronic devices are RFID tags which conduct wireless communications using the circuit chip with the conductor pattern functioning as a communications antenna.

6. An electronic device manufacturing method for manufacturing electronic devices each of which includes a base, a conductor pattern formed into a point-asymmetrical shape alternately on the base, and a circuit chip electrically connected to the conductor pattern, the electronic device manufacturing method comprising: conductor-pattern-forming including forming a plurality of the conductor patterns in such a way that at least some of the plurality of the conductor patterns are formed in a point-symmetrical arrangement including conductor pattern orientations, on a long base sheet large enough to place a plurality of the bases, and winding the base sheet into a roll body; circuit-chip-mounting including pulling the base sheet out of the roll body, mounting the circuit chip on each of the conductor patterns formed on the pulled base sheet in an orientation corresponding to an orientation of the each conductor pattern, and electrically connecting the circuit chip with the conductor pattern; and post-processing including performing post-processing of the base sheet with the circuit chips mounted on the conductor patterns by the circuit-chip-mounting, to work up the base sheet into finished electronic devices.

7. The electronic device manufacturing method according to claim 6, wherein:
the circuit-chip-mounting further includes winding the base sheet, with the circuit chips mounted on the conductor patterns, to produce the roll body; and
the post-processing further includes pulling the base sheet out of the roll body produced by the circuit-chip-mountinq.

8. The electronic device manufacturing method according to claim 6, wherein the circuit-chip-mounting further includes holding the circuit chips, orienting the held circuit chips according to the orientations of the respective conductor patterns, and transporting the circuit chips onto the conductor patterns.

9. The electronic device manufacturing method according to claim 6, wherein:
the conductor-pattern-forming further includes forming the conductor patterns by arranging the conductor patterns regularly in a plurality of predetermined orientations, respectively; and
from a disposing section in which a plurality of circuit chip groups corresponding, respectively, to the plurality of orientations of the conductor patterns are disposed, with the circuit chips in each of the plurality of circuit chip groups having an orientation corresponding to the orientation assigned to the given circuit chip group, the circuit-chip-mounting further includes transporting the circuit chips in each of the plurality of circuit chip groups onto the conductor patterns which have the same orientation as the orientation assigned to the given circuit chip group.

10. The electronic device manufacturing method according to claim 6, wherein the electronic devices are RFID tags which conduct wireless communications using the circuit chip with the conductor pattern functioning as a communications antenna.

* * * * *